United States Patent [19]

Jastrzebski

[11] Patent Number: 4,704,186

[45] Date of Patent: Nov. 3, 1987

[54] RECESSED OXIDE METHOD FOR MAKING A SILICON-ON-INSULATOR SUBSTRATE

[75] Inventor: Lubomir L. Jastrzebski, Plainsboro, N.J.

[73] Assignee: RCA Corporation, Princeton, N.J.

[21] Appl. No.: 830,760

[22] Filed: Feb. 19, 1986

[51] Int. Cl.⁴ .................. C30B 23/04; C30B 25/04; C30B 25/20

[52] U.S. Cl. .................... 156/612; 156/610; 156/613; 156/614; 156/DIG. 64; 148/DIG. 117; 148/DIG. 159; 437/73

[58] Field of Search ............... 156/610, 612, 613, 614, 156/DIG. 64, DIG. 99; 148/DIG. 117, DIG. 159; 427/94, 95

[56] References Cited

U.S. PATENT DOCUMENTS

| | | | |
|---|---|---|---|
| 3,290,753 | 12/1966 | Chang | 427/93 |
| 3,902,936 | 9/1975 | Price | 427/93 |
| 3,969,168 | 7/1976 | Kuhn | 427/93 |
| 4,178,396 | 12/1979 | Okano et al. | 427/93 |
| 4,272,308 | 6/1981 | Varshney | 148/DIG. 117 |
| 4,533,429 | 8/1985 | Josquin | 427/93 |
| 4,549,926 | 10/1985 | Corboy, Jr. et al. | 156/612 |
| 4,578,142 | 3/1986 | Corboy et al. | 156/612 |

FOREIGN PATENT DOCUMENTS 1358438  7/1974  United Kingdom ............... 156/610

Primary Examiner—Gregory A. Heller
Assistant Examiner—Robert M. Kunemund
Attorney, Agent, or Firm—Allen LeRoy Limberg; James M. Trygg; Kenneth R. Glick

[57] ABSTRACT

A plurality of first cavities is formed in the planar surface of a silicon substrate. A first oxide region of predetermined thickness is formed in each of the first cavities such that each of the first oxide regions has a surface which is coplanar with the substrate surface. A layer of monocrystalline silicon is then epitaxially deposited over the planar first oxide region/substrate surface. Second cavities are then formed through the monocrystalline silicon layer and into the substrate adjacent the first oxide regions, extending to a depth equal to approximately one-half that of the first oxide regions. The second cavities are then thermally oxidized so as to form second oxide regions therein, these second oxide regions being coplanar with the first oxide regions. Silicon is next epitaxially deposited on those portions of the monocrystalline silicon layer remaining on the first oxide regions so as to yield a continuous monocrystalline silicon sheet over the first and second oxide regions.

5 Claims, 11 Drawing Figures

RECESSED OXIDE METHOD FOR MAKING A SILICON-ON-INSULATOR SUBSTRATE

The present invention relates to a method for fabricating an electrically isolated monocrystalline silicon layer on a major surface of a silicon wafer. More particularly, the invention relates to a process for fabricating a monocrystalline silicon layer on a uniformly thick layer of silicon oxide.

BACKGROUND OF THE INVENTION

Microelectronic semiconductor devices such as transistors, resistors and diodes are conventionally fabricated in monocrystalline silicon substrates and in monocrystalline silicon films on sapphire substrates. A plurality of such devices may be interconnected to form a monolithic integrated circuit structure on a "chip," i.e., a relatively small piece of a substrate wafer. Devices are fabricated on sapphire substrates, and termed silicon-on-sapphire or SOS structures, when it is desired to isolate individual devices from one another. Such isolation may be important, for example, when the ambient environment in which the chip is to operate includes ionizing radiation. Compared to structures fabricated in bulk silicon substrates, SOS structures in such environments provide no crosstalk among devices on a chip and no latchup between N channel and P channel field effect transistors (FETs) in the case of complementary metal oxide semiconductor (CMOS) structures.

However, conventional SOS structures also have certain inherent disadvantages. When the silicon film on the sapphire surface is relatively thin, i.e. less than approximately 0.3 microns (3000 Angstroms), the crystallographic quality thereof is significantly reduced. This in turn causes charge carrier mobility to be relatively low and minority carrier lifetime to be relatively short. Additionally, compared to silicon substrates, sapphire substrates are relatively expensive and are in shorter supply.

In commonly assigned U.S. patent application Ser. No. 818,032, METHOD FOR MAKING A SILICON-ON-INSULATOR SUBSTRATE, L. L. Jastrzebski, filed Jan. 13, 1986, now pending a process is described for fabricating a silicon-on-insulator (SOI) substrate having its foundation on a silicon wafer. Although the SOI structure disclosed therein is effective, the fabrication process presents certain inherent limitations in thickness of the oxide insulator layer and uniformity of thickness of the oxide insulator layer. The present invention overcomes these limitations.

SUMMARY OF THE INVENTION

A plurality of first cavities is formed in the planar surface of a silicon substrate. A first oxide region of predetermined thickness is formed in each of the first cavities such that each of the first oxide regions has a surface which is coplanar with the substrate surface. A layer of monocrystalline silicon is then epitaxially deposited over the planar first oxide region/substrate surface. Second cavities are then formed through the monocrystalline silicon layer and into the substrate adjacent the first oxide regions, extending to a depth equal to approximately one-half that of the first oxide regions. The second cavities are then thermally oxidized so as to form second oxide regions therein, these second oxide regions being coplanar with the first oxide regions. Silicon is next epitaxially deposited on those portions of the monocrystalline silicon layer remaining on the first oxide regions so as to yield a continuous monocrystalline silicon sheet over the first and second oxide regions.

DETAILED DESCRIPTION OF PREFERRED EMBODIMENT

Figure 1:
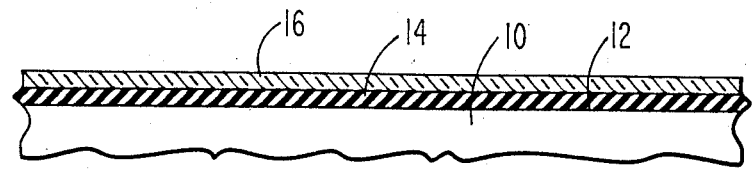
FIGS. 1-11 are sectional views of a portion of a semiconductor substrate fabricated in accordance with the method of the present invention.

As shown in FIG. 1, a monocrystalline silicon substrate 10 having a major surface 12 is initially provided. A first oxidation barrier layer 14 of a material such as silicon nitride is disposed on the surface 12 and an optional barrier protection layer 16 of a material such as silicon oxide is disposed on the first barrier layer 14. Both the protection layer 16 and the first barrier layer 14 may be deposited by conventional processing techniques, such as chemical vapor deposition.

Figure 2:
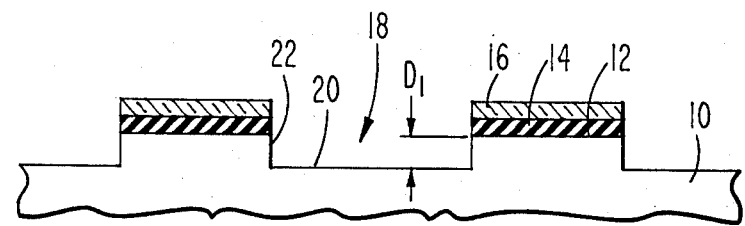

One or more portions of the protection layer 16 and first barrier layer 14 as well as corresponding underlying portions of the substrate 10 are then selectively removed by standard photolithographic pattern generating and etching techniques. As shown in FIG. 2, the resulting structure includes a plurality of first cavities 18 in the original surface 12 of the substrate 10. The first cavities 18 have relatively flat bottom portions identified at 20 which are parallel to the original major surface 12 and substantially vertical walls 22 which are perpendicular to the bottom portions 20. The depth of the first cavities 18 (measured from the surface 12) is identified as $D_1$, and is equal to approximately one half the oxide insulator thickness which is ultimately desired.

Figure 3:
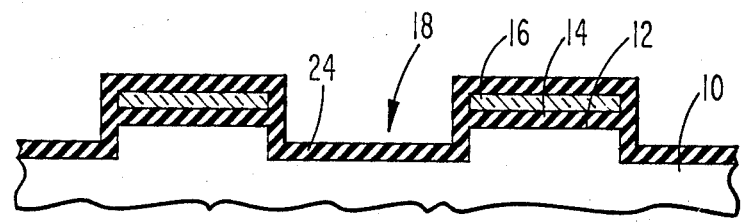

As shown in FIG. 3, a second oxidation barrier layer 24 is next applied over the exposed surfaces of the protection layer 16, first barrier layer 14 and first cavities 18. The second barrier layer 24 may also be silicon nitride and may also be deposited in a conventional manner such as by CVD. The second barrier layer 24, when silicon nitride, might conveniently be approximately 1000 Angstroms thick.

Figure 4:
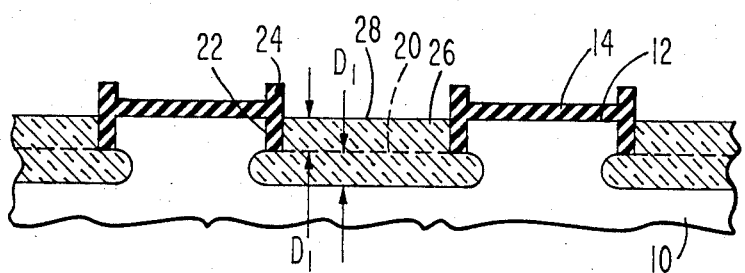

As shown in FIG. 4, the second barrier layer 24 is next anisotropically etched so as to remove those portions thereof on the cavity bottoms 20. This anisotropic etching will also remove those portions of the second barrier layer 24 on the top surface of protection layer 16 but will leave those portions that are on the walls 22 of the first cavities 18 (and on the exposed edges of the first barrier layer 14 and protection layer 16). This anisotropic etching may be performed, for example, by conventional plasma etching techniques. It should be noted that although this anisotropic etching leaves portions of the second barrier layer 24 over the exposed edges of the first barrier layer 14 and protection layer 16, it is important only that the walls 22 of the silicon substrate 10 be covered and that the bottom portions 20 be exposed.

During the etching of the second barrier layer 24, the protection layer 16 serves to shield the underlying first barrier layer 14. However, it should be understood that if this anisotropic etching step can be sufficiently closely controlled so as to permit cessation of the etching prior to etching through the first barrier layer 14 (and exposing the substrate 10), then the protection layer 16 need not be used. Thus, as previously indicated, the use of the protection layer 16 is optional depending upon the accuracy of process control.

Following the anisotropic etching of the barrier layer 24, protection layer 16 is removed and a first oxide region 26 is formed at the location of each first cavity 18, as shown in FIG. 4. The first oxide regions 26 are formed by thermal oxidation so as to yield a predetermined thickness $D_1$ of oxide extending above the original cavity bottom 20, and substantially the same predetermined thickness $D_1$ beneath the cavity bottom 20. The parameters for the thermal oxidation of silicon are well established such that the surface 28 of the first oxide regions 26 can be precisely grown to a thickness $D_1$, thereby yielding a surface 28 coplanar with the substrate surface 12. Assuming an original cavity depth $D_1$ of 2500 Angstroms, heating the structure at approximately 1000° C., in steam, for approximately 100 minutes will yield the illustrated first oxide regions 26. The thickness of the first oxide regions 26 will be approximately twice $D_i$ (5000 Angstroms in this example), since the thermal oxidation of the exposed silicon surface 20 yields an approximately equal oxide thicknesses above and below the surface.

Figure 5:
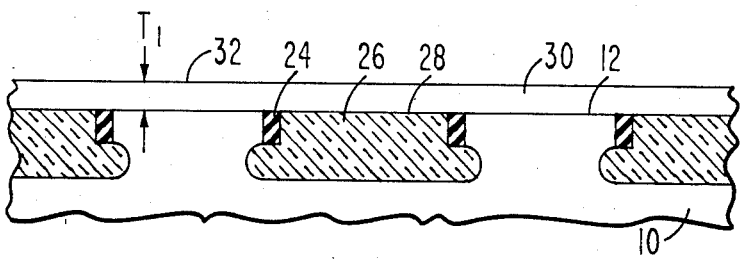

The first barrier layer 14 and portions of the second barrier layer 24 which extend above the substrate surface 12 are next stripped from the surface, for example, by conventional wet chemical etching techniques. As shown in FIG. 5, a monocrystalline silicon layer 30 is then deposited over the planar first oxide region/substrate surface 28/12. The monocrystalline silicon layer 30 has a substantially planar surface 32 parallel to the planar oxide region/substrate surface 28/12 and may effectively be formed by the epitaxial lateral overgrowth (ELO) technique which is elaborated upon in commonly assigned U.S. patent application Ser. No. 608,544, METHOD FOR GROWING MONOCRYSTALLINE SILICON THROUGH A MASK LAYER, J. F. Corboy, Jr. et al. filed May 10, 1984, now U.S. Pat. No. 4,578,148.

Basically, the ELO process comprises a two stage silicon deposition/etching cycle. In the deposition stage silicon is deposited from a gas mixture which includes a silicon source gas, such as silane ($SiH_4$), dichlorosilane ($SiH_2Cl_2$) or silicon tetrachloride ($SiCl_4$), and optionally a carrier gas, such as hydrogen, and a silicon etching gas, such as HCl. In the etching stage a portion of the silicon deposited during the deposition stage is etched in a gas mixture which includes a silicon etching gas, such as HCl. The exposed portions of the monocrystalline silicon substrate surface 12 serve as nucleation sites for the epitaxial silicon growth. Repeating the deposition/etching cycle yields a vertical and horizontal growth from each site until the illustrated monocrystalline silicon layer 30 having a thickness $T_1$ is formed. $T_1$ might conveniently be approximately 2 microns.

Figure 6:
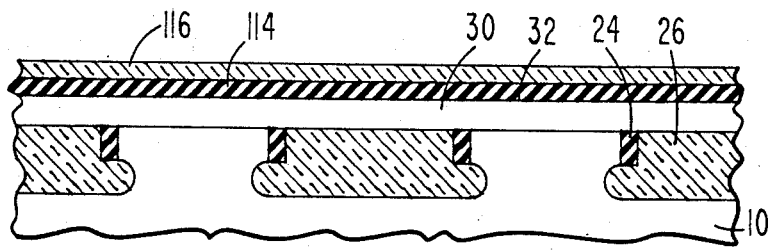

As shown in FIG. 6, a third barrier layer 114, of a material such as silicon nitride, is next deposited on the surface 32 of the monocrystalline silicon layer 30, and a second protection layer 116, of a material such as silicon oxide, is optionally provided on the surface of the third barrier layer 114. The third barrier layer 114 and second protection layer 116 can be provided by similar processing used to produce the first barrier layer 14 and protection layer 16 of FIG. 1. Hence, the nomenclature for this step, as well as for similar subsequent steps, is also similar.

Figure 7:
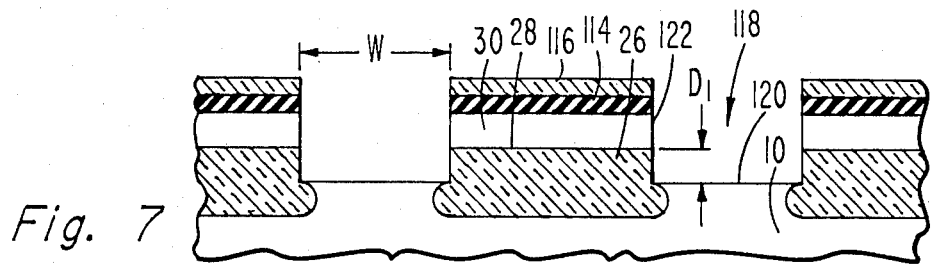

A plurality of second cavities 118 are then formed through the third barrier layer 114, second protection layer 116 and monocrystalline silicon layer 30 into the substrate 10, so as to yield the structure of FIG. 7. The second cavities 118 are located between and adjacent the previously formed first oxide regions 26 and extend to a depth $D_1$ beneath the oxide surface 28. The cavities 118 each include bottom surfaces 120 which are substantially parallel to the surface 28 and walls 122 that are substantially perpendicular to the bottoms 120. The width of each cavity 118, as identified at W in FIG. 7, is such that no monocrystalline silicon substrate 10 is present between neighboring first oxide regions 26, although, portions of the second barrier layer 24 shown in FIG. 6 may remain as part of the walls 122 of the second cavities 118. The second cavities 118 may be fabricated by conventional photolithographic pattern generation and etching techniques. For example, a complementary (reverse tone) photoresist mask from that used to produce the structure of FIG. 2 may be used on the structure of FIG. 6 prior to etching the second cavities 118.

Figure 8:
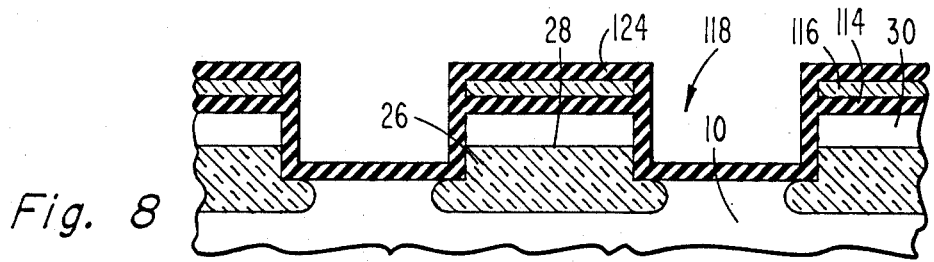
Figure 9:
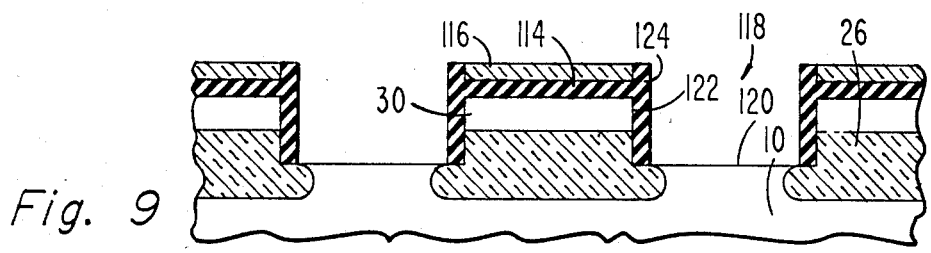
Figure 10:
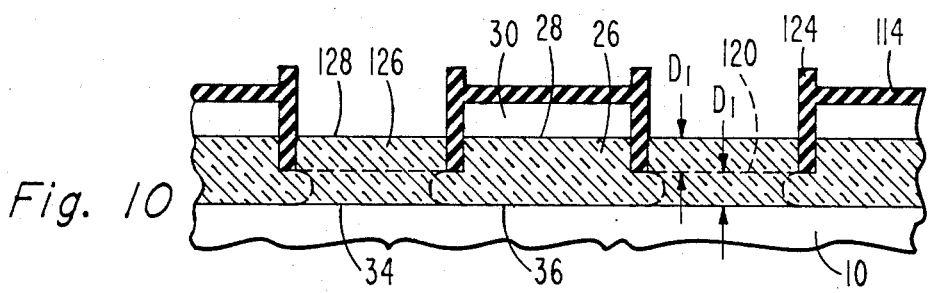

As shown in FIG. 8, a fourth oxidation barrier layer 124 is then deposited over the exposed surfaces of the protection layer 116 and second cavities 118. The fourth barrier layer 124 is preferably a material such as silicon nitride and is conventionally deposited e.g. to a thickness of 1000 Angstroms, by CVD. The fourth barrier layer 124 is then anisotropically etched in a manner similar to the anisotropic etching of the second barrier layer 24 shown in FIG. 3 so as to expose the bottoms 120 of the cavities 118 and protect the walls 122 of the cavities 118 as shown in FIG. 9. Again, the portion of the fourth barrier layer 124 on the surface of the protection layer 116 will also be removed during this anisotropic etching step and the need for the protection layer 116 may be obviated if precise etching control is practicable (so as to not etch through the third barrier layer 114 and into the underlying monocrystalline silicon layer 30).

The protection layer 116 is then stripped and the structure of FIG. 9, is subjected to a thermal oxidation sequence similar to the sequence used to form the first oxide regions 26 of FIG. 4. This thermal oxidation sequence yields second oxide regions 126 of similar thickness ($2D_1$) to the first oxide regions 26. The second oxide regions 126 will thus have a surface 128 which is coplanar with the surface 28 between the first oxide regions 26 and overlying monocrystalline silicon layer 30. Furthermore, the interface between the second oxide regions 126 and underlying monocrystalline silicon substrate 10, as identified at 34, will be coplanar with the corresponding interface between the first oxide regions 26 and underlying substrate 10, as identified at 36. Thus, the first and second oxide regions 26 and 126 present a monolithic and planar oxide insulator layer on the surface of the substrate 10, although portions of the fourth barrier layer 124 do extend approximately halfway into the thickness thereof at certain locations from the surface 28/128.

Figure 11:
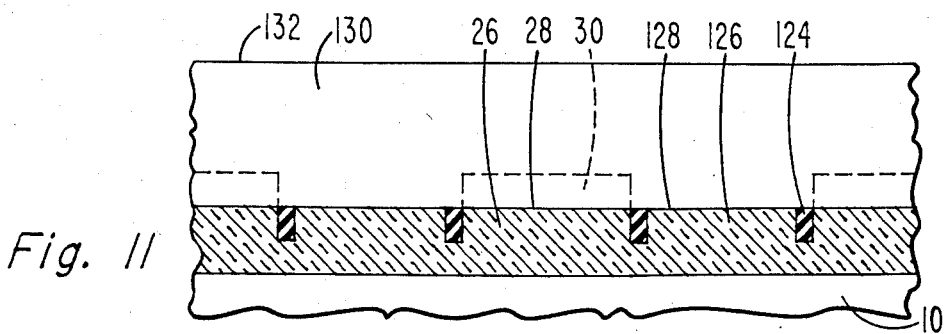

Next, the third barrier layer 114 and the portions of the fourth barrier layer 124 which extend beyond the surface 28/128 are removed, e.g. by conventional wet chemical etching. The portions of the monocrystalline silicon layer 30 on the first oxide regions 26 are then used as nucleation sites for the epitaxial deposition of a monocrystalline silicon sheet 130 over the entire surface 28/128 as shown in FIG. 11. Again, this epitaxial deposition may conveniently be performed by the previously described ELO technique. The resulting monocrystalline silicon sheet 130 may be grown to any convenient thickness and will have a substantially planar external surface 132.

This structure of FIG. 11 may now be used as an SOI substrate for further processing. The substantially uniformly thick monocrystalline silicon sheet 130 is completely electrically isolated from the underlying monocrystalline silicon substrate 10 by the oxide insulator layer comprising the first oxide regions 126 and second oxide regions 128. CMOS devices may be fabricated in a conventional manner in the monocrystalline silicon sheet 130 and will be effectively isolated from the substrate 10. The present process permits control over the degree of dielectric isolation of the devices subsequently fabricated in the monocrystalline silicon sheet 130 from the substrate 10 by varying the thickness ($2D_1$) of the oxide insulator layer. Furthermore, the substantially flat surface 132 presents an optimal topology for further standard processing steps.

I claim:

1. A method for forming an electrically isolated layer of monocrystalline silicon on a silicon substrate, comprising:
   (a) providing a silicon substrate having a substantially planar surface;
   (b) forming a plurality of first cavities in said surface;
   (c) forming a first oxide region only in each of the first cavities, by thermal oxidation each of the first oxide regions having a surface which is coplanar with the substrate surface;
   (d) epitaxially depositing a layer of monocrystalline silicon over the planar first oxide region/substrate surface;
   (e) forming second cavities through the monocrystalline silicon layer and into the substrate adjacent the first oxide regions, to a depth equal to approximately one-half that of the first oxide regions;
   (f) thermally oxidizing only the second cavities so as to form second oxide regions therein, the second oxide regions being coplanar with the first oxide regions; and
   (g) epitaxially depositing silicon on those portions of the monocrystalline silicon layer on the first oxide regions so as to form a continuous monocrystalline silicon sheet over the first and second oxide regions.

2. A method in accordance with claim 1 further comprising:
   forming the first cavities so as to have bottoms parallel to the substrate surface and walls perpendicular to the bottoms; and
   forming an oxidation barrier layer on the walls of the first cavities prior to forming the first oxide regions.

3. A method in accordance with claim 2 further comprising:
   forming an oxidation barrier layer over the walls and bottoms of the first cavities; and
   anisotropically etching the oxidation barrier layer such that it is selectively removed from the bottoms of the first cavities.

4. A method in accordance with claim 1 further comprising:
   forming the second cavities so as to have bottoms parallel to the substrate surface and walls perpendicular to the bottoms; and
   forming an oxidation barrier layer on the walls of the second cavities prior to forming the second oxide regions.

5. A method in accordance with claim 2 further comprising:
   forming an oxidation barrier layer over the walls and bottoms of the second cavities; and
   anisotropically etching the oxidation barrier layer such that it is selectively removed from the bottoms of the second cavities.

* * * * *